United States Patent [19]
El-Diwany

[11] Patent Number: 5,766,990
[45] Date of Patent: Jun. 16, 1998

[54] METHOD OF MANUFACTURING A HIGH SPEED BIPOLAR TRANSISTOR IN A CMOS PROCESS

[75] Inventor: Monir El-Diwany, Saratoga, Calif.

[73] Assignee: National Semiconductor Corporation, Santa Clara, Calif.

[21] Appl. No.: 907,874

[22] Filed: Aug. 11, 1997

[51] Int. Cl.$^6$ .................................................. H01L 21/8238
[52] U.S. Cl. .................... 438/202; 438/234; 148/DIG. 9
[58] Field of Search ................................. 438/202, 203, 438/204, 205, 234, 236; 148/DIG. 9

[56] References Cited

U.S. PATENT DOCUMENTS

| | | |
|---|---|---|
| 5,001,081 | 3/1991 | Tuntasood et al. . |
| 5,081,518 | 1/1992 | El-Diwany et al. . |
| 5,082,796 | 1/1992 | El-Diwany et al. . |
| 5,124,817 | 6/1992 | Brassington et al. . |
| 5,132,234 | 7/1992 | Kim et al. ............... 148/DIG. 9 |
| 5,171,702 | 12/1992 | Prengle et al. ............. 438/234 |
| 5,179,031 | 1/1993 | Brassington et al. . |
| 5,196,356 | 3/1993 | Won et al. ................. 438/203 |
| 5,607,866 | 3/1997 | Sato et al. ............. 148/DIG. 9 |

OTHER PUBLICATIONS

Shih Wei Sun, et al., "A 0.4-Micron Fully Complementary BiCMOS Technology for Advanced Logic Microprocessor Applications", IEDM, 1991, pp. 85–88.

J. Kirchgessner, et al., "An Advanced 0.4μm BiCMOS Technology For High Performance ASIC Applications", IEDM, 1997, pp. 97–100.

*Primary Examiner*—Tuan H. Nguyen
*Attorney, Agent, or Firm*—Limbach & Limbach L.L.P.

[57] ABSTRACT

Fabrication of a high frequency bipolar transistor structure is integrated into a CMOS process flow with minimal additional cost. The polysilicon emitter of the bipolar device and the polysilicon gate of the MOS device use separate polysilicon layers and, therefore, allow the bipolar emitter and the MOS gate to be doped independently of each other. The process scheme does not require the MOS device to be subdivided.

2 Claims, 8 Drawing Sheets

METHOD OF MANUFACTURING A HIGH SPEED BIPOLAR TRANSISTOR IN A CMOS PROCESS

BACKGROUND OF THE INVENTION

1. Field of the Invention

The present invention relates to methods of fabricating integrated circuits and, in particular, to a method of integrating a high frequency bipolar transistor structure into a CMOS process flow with minimum additional cost.

2. Discussion of the Related Art

Since the mid-1980's, processes have been available for fabricating both bipolar and CMOS integrated circuit device structures on the same chip. U.S. Pat. Nos. 5,001,081 and 5,124,817 both disclose processes for fabricating bipolar and CMOS devices (i.e., so-called BiCMOS processes) utilizing a single polysilicon architecture.

The single polysilicon scheme used in earlier generation BiCMOS processes has the advantage of using one polysilicon layer for forming both the emitters of the bipolar transistors and the gates of the MOS transistors, with understandable cost advantages. Unfortunately, the built-in offset between the polysilicon emitter and the polysilicon gate thicknesses leads to a process window that limits the minimum emitter/base junction depth and, hence, the scalability of the bipolar transistor to higher frequencies. Furthermore, a single polysilicon layer for both the bipolar emitter and the MOS gate implies an implanted polysilicon layer versus other means of polysilicon doping, for example, POCl$_3$ or in-situ doping. Implanted polysilicon implies higher resistivity (other means of delivering dopant into polysilicon such as POCl2 process or in situ doping can deliver a much higher dopant concentration and therefore lower resistivities). Therefore, an implanted polysilicon gate layer in most state-of-the-art COMS processes invariably requires salicide to lower the polysilicon gate sheet resistance. That excludes many CMOS processes from consideration as BiCMOS (specifically with high performance polysilicon emitter bipolar transistors). It should be pointed out that for high performance bipolar transistors, the dopant concentration in the polysilicon emitter must be precisely controlled to maintain reproducible characteristics. Implant of the polysilicon is the main option available for delivering well controlled dopant concentrations.

These shortcomings of single polysilicon BiCMOS processes have, however, been recognized. The proposed solutions have resulted in complicated process schemes. For example, Sun et al., "A 0.4 Micron Fully Complimentary BiCMOS Technology for Advanced Logic and Microprocessor Applications", IEDM-91, pp. 85–88, describe a BiCMOS process that utilizes multiple polysilicon layers in a relatively complicated scheme.

In another publication, Kirchgessner et al., "An Advanced 0.4 μm BiCMOS Technology for High Performance ASIC Applications", IEDM-91, pp. 97–100, describe attempts to address some of the limitations associated with the single polysilicon layer scheme. In the Kirchgessner et al. process, the polysilicon emitter etch in the base region stops on oxide and, therefore, avoids the built-in offset between the polysilicon emitter and gate thicknesses. However, an obvious drawback of this scheme is the high resistivity base regions under the emitter mantles which are created by the polysilicon emitter overlap over the emitter opening. These mantles can be comparable to the emitter width in a deep sub-micron process. The additional base resistance can be fatal for the high frequency performance of the NPN bipolar device.

SUMMARY OF THE INVENTION

The present invention provides a simple process scheme that alleviates the constraints associated with the prior art. While allowing aggressive scaling of the bipolar transistor architecture, the process still maintains a simple CMOS process manufacturing sequence. In accordance with the method, the polysilicon emitter and polysilicon gate use separate polysilicon layers and, therefore, allow the polysilicon emitter and the MOS gate to be doped independently of each other. This removes any restrictions on the CMOS transistor architecture, especially the PMOS devices. For example, further scaling of this BiCMOS process is not hampered by evolution in the CMOS architecture, for example, from buried to surface channel PMOS. Although the final cross-section of the disclosed process sequence shows the bipolar and MOS devices to be salicided, the scheme does not require the MOS devices to be salicided.

There are additional benefits to the inventive process flow. It provides a built-in polysilicon-to-polysilicon linear capacitor, which is commonly required in many mixed signal and analog functions. The scheme also makes it easier to form the salicide. First, it improves the surface properties of the polysilicon gate for silicidation by retaining the ONO layer up to the formation of the silicide; doped polysilicon layers that are repeatedly exposed to oxidation cycles develop rough surfaces with oxidized grain boundaries that are difficult to silicide. Second, it allows the use of thinner polysilicon gate layers; thinner polysilicon layers are desirable in deep sub-micron CMOS processes with very limited thermal budget since they are easier to dope and also reduce wafer topography and, therefore, are easier to planarize.

Salicide formation on thin polysilicon gate layers, however, provides its own set of challenges: impact on gate oxide integrity, especially for thick silicides, and crawl out of silicon from the source/drain regions alongside the oxide spacers can ultimately result in electrical shorts between the gate and source/drain regions. Both of these problems are aggravated by higher rapid-thermal-anneal (RTA) temperatures. The likelihood of shorts is directly related to the distance between the top of the polysilicon gate alongside the oxide spacers to the source/drain. An advantage of the inventive process is that the recess of the polysilicon gate from the top of the oxide spacers, which is equal to the thickness of the ONO layers, increases that distance and, hence, reduces the likelihood of shorts. It should be pointed out that the same arguments also apply to polysilicon emitter-to-base shorts and, for the same reasons, the polysilicon emitter may also be fitted with ONO layers. However, since the likelihood of shorts is also proportional to the number of transistors on one die, whether to retrofit the polysilicon emitter with ONO or not will depend upon the application and upon the polysilicon emitter thickness as well.

A better understanding of the features and advantages of the present invention will be obtained by reference to the following detailed description and accompanying drawings which set forth an illustrative embodiment in which the concepts of the invention are utilized.

DETAILED DESCRIPTION OF THE INVENTION

A process flow for fabricating integrated circuit structures in accordance with the concepts of the present invention will now be described in conjunction with the partial cross-sectional drawings provided in FIGS. 1A–1P. While specific process parameters are not provided in all cases, those skilled in the art will appreciate that the concepts of the invention are applicable regardless of these parameters, which will differ depending upon the specific device structure under manufacture.

Figure 1A:
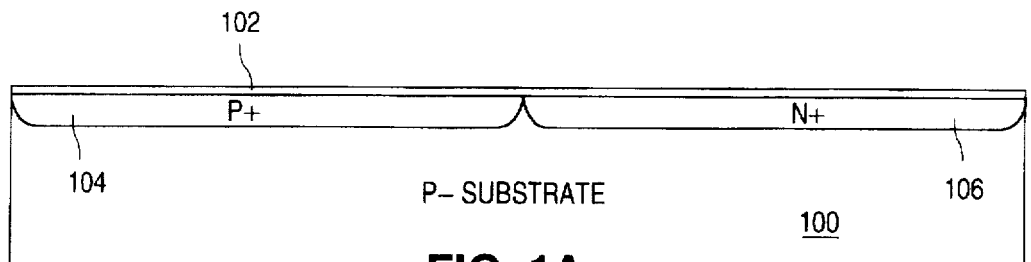
FIGS. 1A –1P are partial cross-sectional drawings illustrating a method of fabricating a bipolar transistor in a CMOS process flow in accordance with the concepts of the present invention.
Figure 1B:
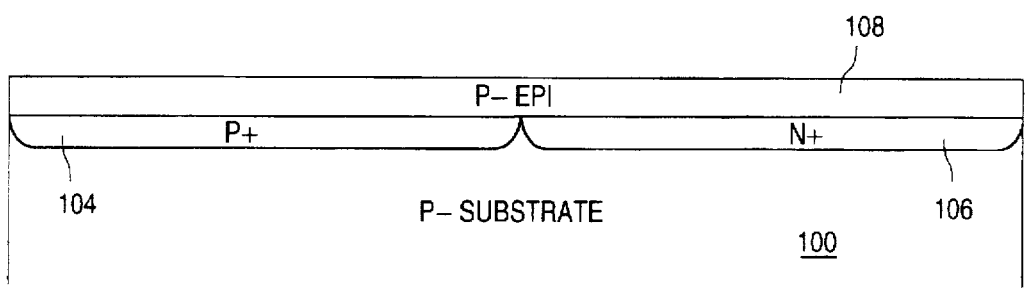

FIG. 1A shows a substrate 100 of P-[100] silicon having a layer of silicon oxide 102 formed thereon. A P+ buried layer 104 and a N+ buried layer 106 are formed in the substrate 100 in accordance with conventional integrated circuit fabrication techniques. A layer of P-epitaxial silicon about 6000Å thick is then formed on the wafer, resulting in the structure shown in FIG. 1B.

Following an N-well implant to form N-well region 110, a composite oxide layer (not shown) is formed on the surface of the wafer and field oxide isolation regions 112 are formed in accordance with conventional semiconductor integrated circuit processing techniques. An initial, optimal, sinker implant is then performed to provide the preliminary N+ sinker region 114. P-well, $V_{TN}$ and PMOS $V_T$ implants are then performed in the CMOS regions of the wafer.

Figure 1C:
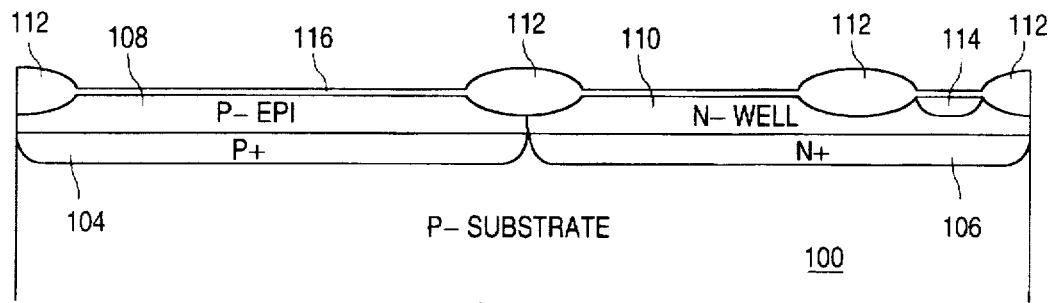

A layer of gate oxide 116 is then grown over the active device regions, resulting in the structure shown in FIG. 1C.

Figure 1D:
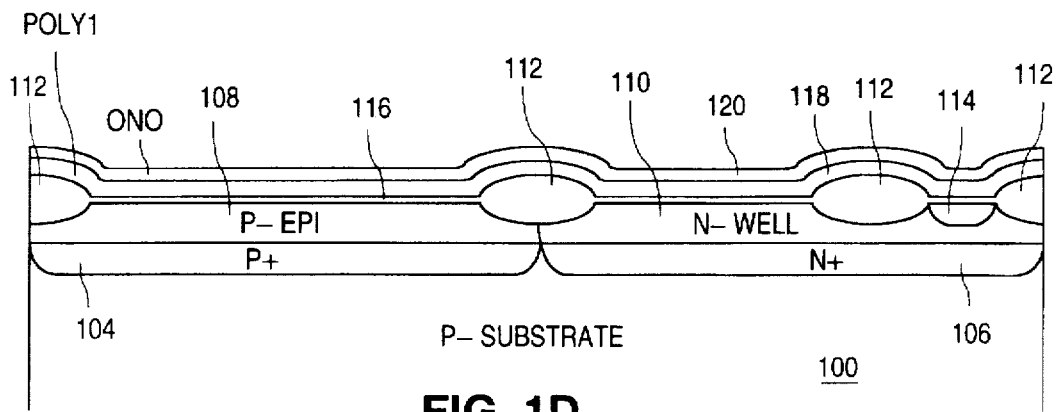

As shown in FIG. 1D, a first layer of polysilicon 118 is then deposited and doped to a selected conductivity level using conventional techniques, e.g., $POCl_3$ doping. A layer of oxide/nitride/oxide (ONS) 120 is then formed on the doped poly 1 layer 118.

Figure 1E:
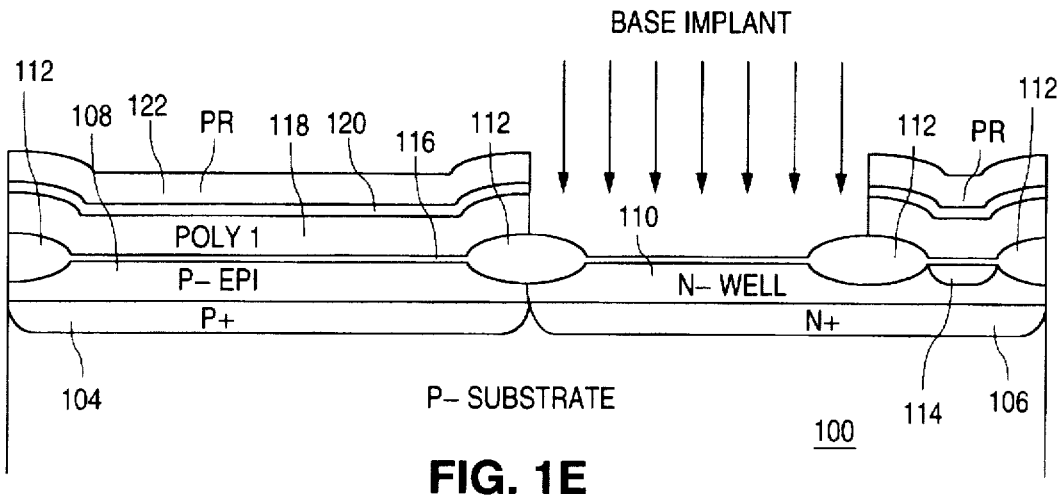
Figure 1F:
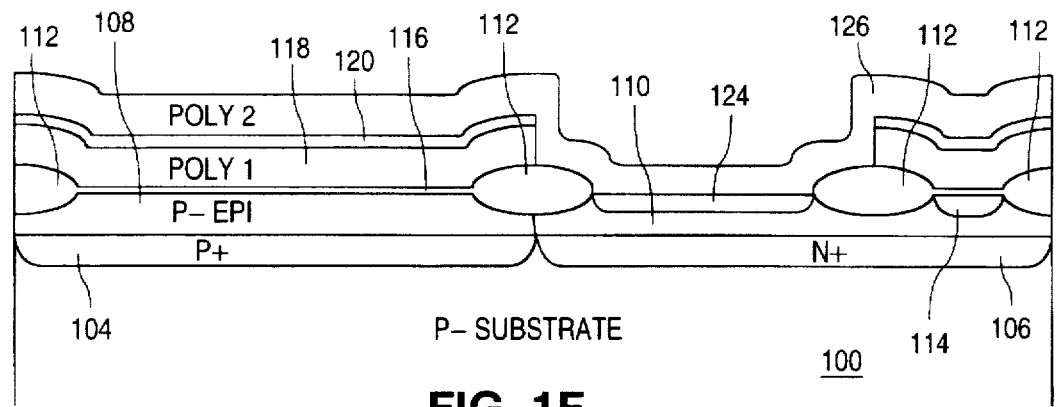

Next, as shown in FIG. 1E, a photoresist (PR) mask 122 is defined to expose the N-well region 110. The exposed poly 1 118 is etched and a base implant is performed to define N-type base region 124. The gate oxide 116 overlying the base region 124 is then wet etched and a second layer of polysilicon 126 is deposited, resulting in the structure shown in FIG. 1F.

Figure 1G:
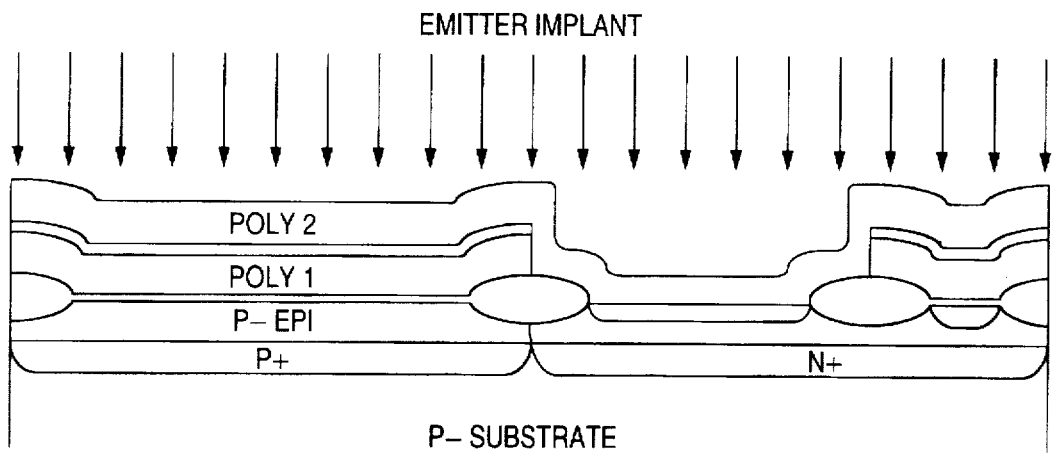

As shown in FIG. 1G, an emitter implant is then performed everywhere on the device to dope the poly 2 layer 126 to a desired conductivity level.

Figure 1H:
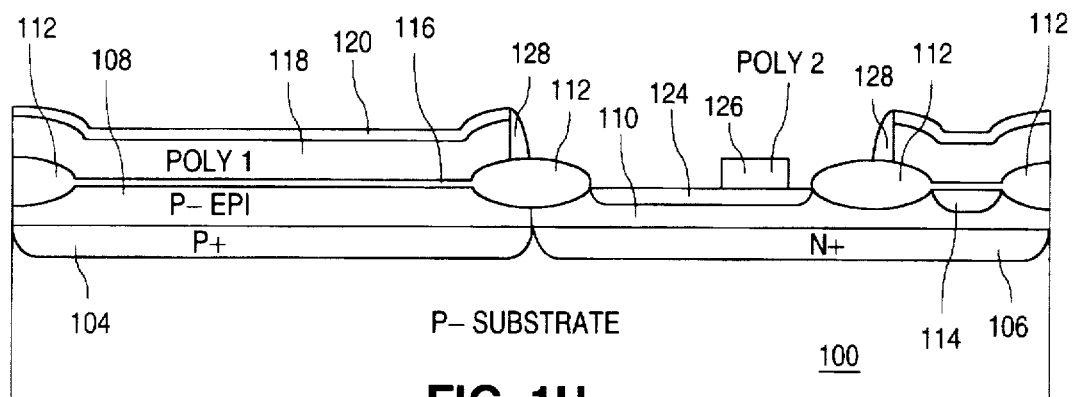
Figure 1I:
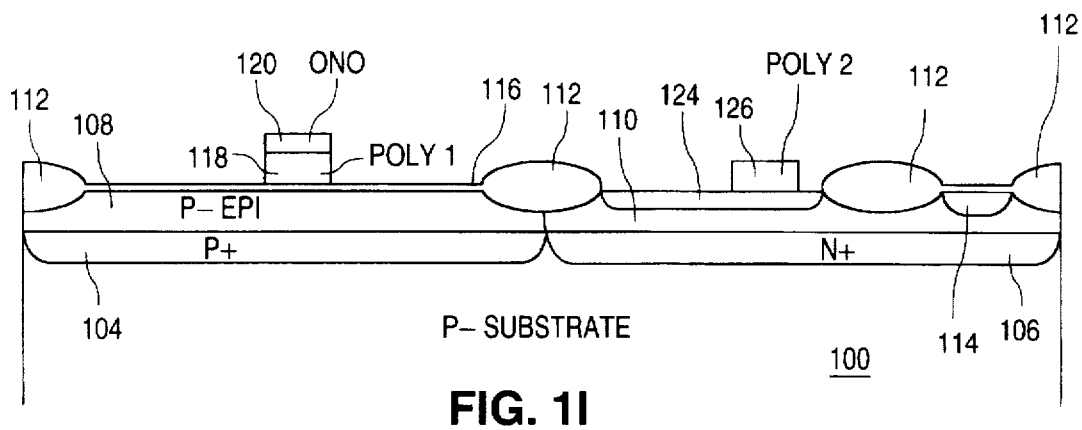

Referring to FIG. 1H, an emitter mask (not shown) is then formed and the second polysilicon layer 126 is etched to form a doped poly 2 emitter 126 overlying the base region 124. The emitter mask is then stripped and a gate mask (not shown) is formed, allowing the poly 1 layer 116 to be etched to define the poly 1 gate region 118 with overlying ONO 120 for the MOS devices, as shown in FIG. 1I.

Figure 1J:
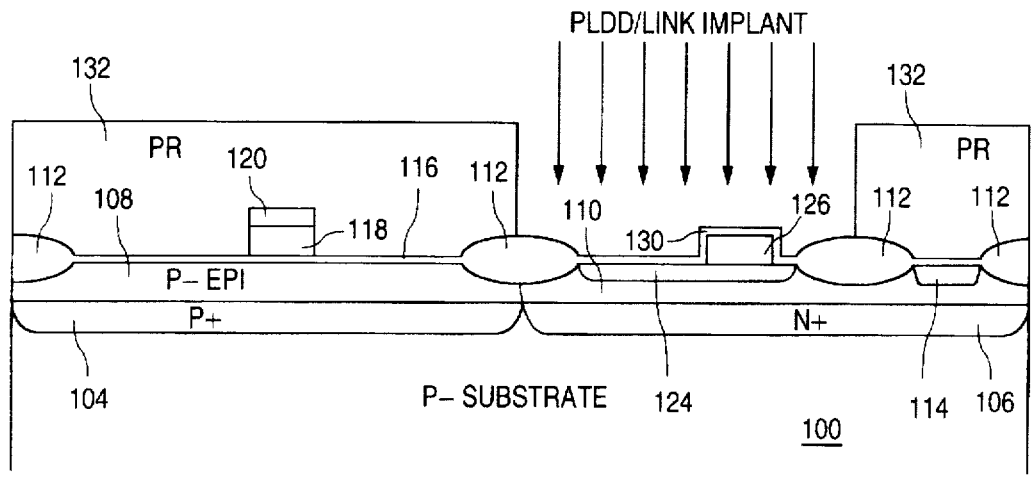
Figure 1K:
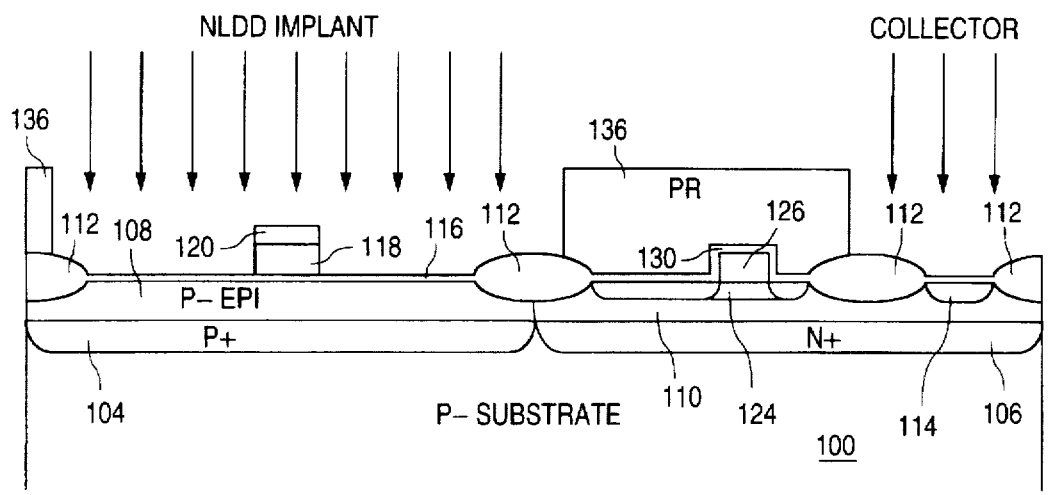
Figure 1L:
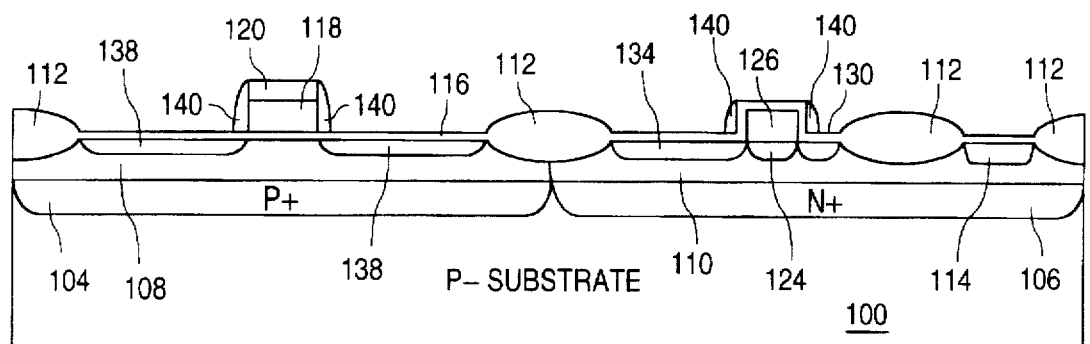

The process then proceeds in accordance with conventional processing techniques. That is, as shown in FIG. 1J, polysilicon gate seal oxide 130 is formed over the FIG. 1H structure. PLDD mask (132) and link implant steps are then performed. As shown in FIG. 1K, this is followed by an NLDD mask (136) and implant step. A layer of spacer oxide is then deposited and etched to form sidewall spacers 140 on the sidewalls of the polysilicon gate 118 and the sidewalls of the polysilicon emitter 126, as shown in FIG. 1C.

Figure 1M:
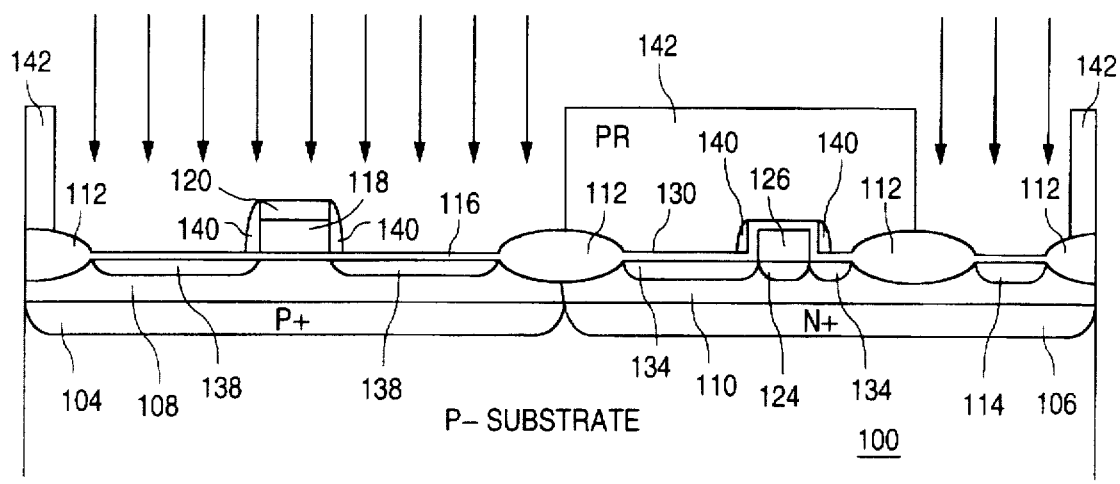
Figure 1N:
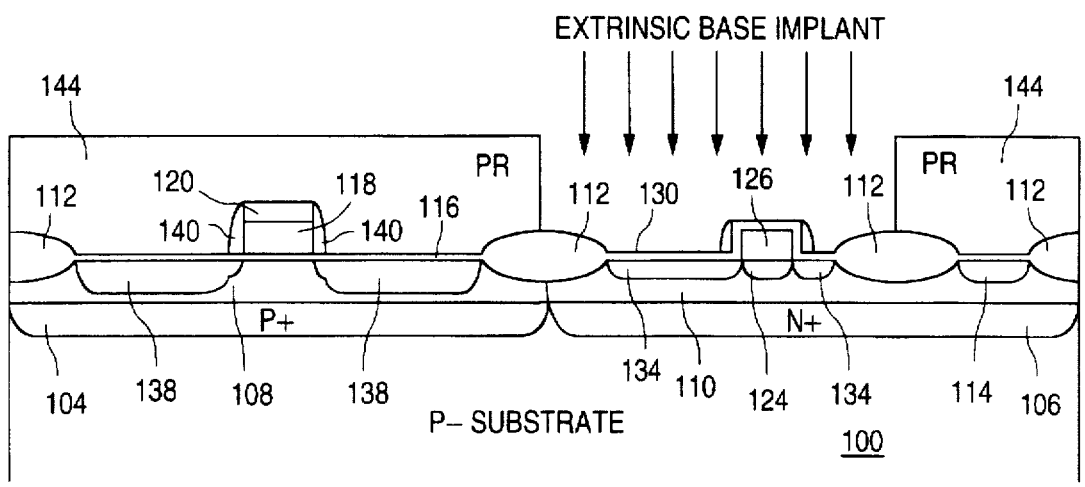
Figure 1O:
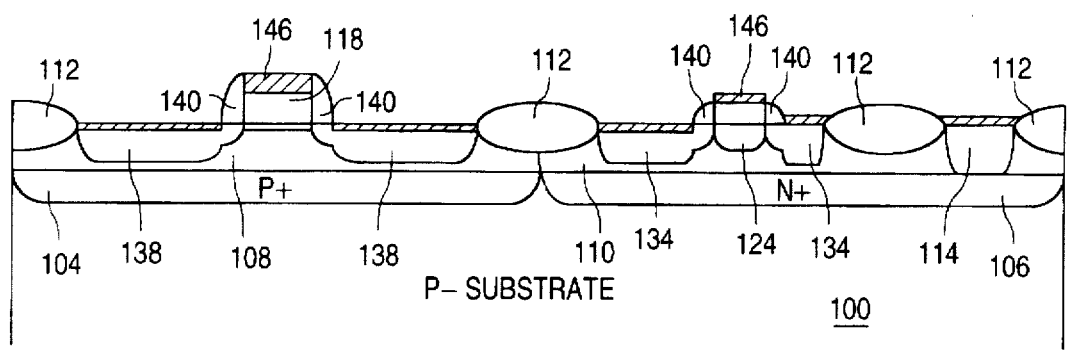
Figure 1P:
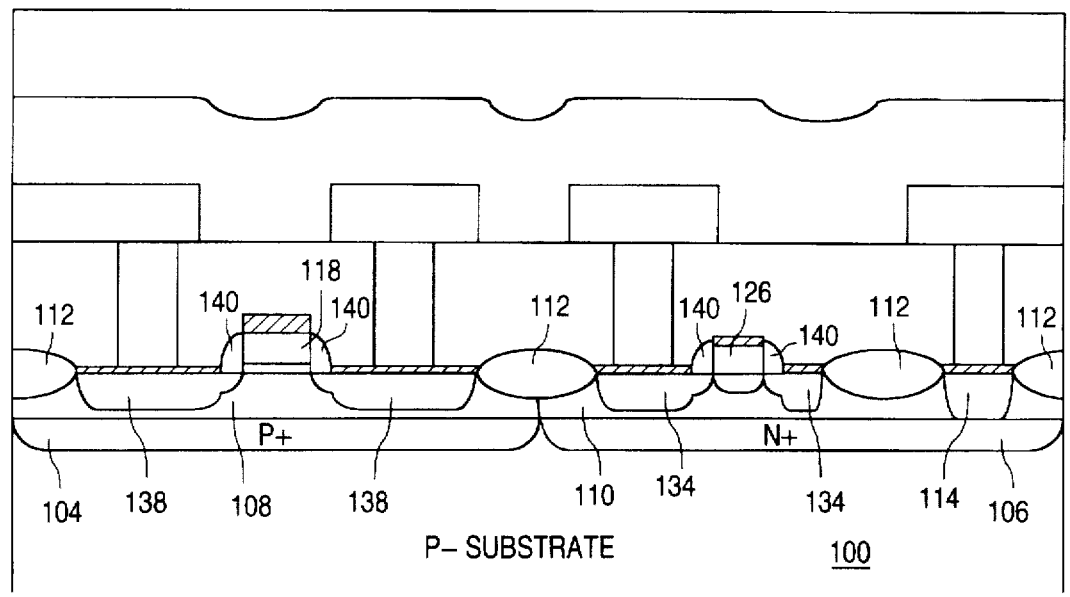

Referring to FIG. 1M, N+ and P+ source/drain mask implant steps are then performed with the bipolar device region protected by photoresist. Next, an extrinsic base mask 144 is formed and an extrinsic base implant is performed in the bipolar region. This is followed by an optional conventional silicide module and rapid thermal processing (RTP) steps for a final anneal, resulting in the structure shown in FIG. 10.

In a final back-end processing flow, a first layer 148 of TEOS is deposited and chemically mechanically polished. The contact mask is then formed and etched and the TEOS layer 148 is etched to provide contact openings. A first layer of metal 150 is then formed, masked and etched to provide contacts to the exposed salicide regions. A second layer of dielectric material 152, and subjected to chemical mechanical polishing (CMP); spin-on glass (SOG) is also an option. A via mask and etch step is followed by a deposition of a second layer of metal 154 to provide contact to the metal 1 plugs. Following the metal 2 mask and etch, a layer of passivating spin-on glass and nitride is formed, and the passivation is etched back resulting in the final device structure shown in FIG. 1P. The process can proceed with the formation of multiple layers of metal interconnects.

Figure 2A:
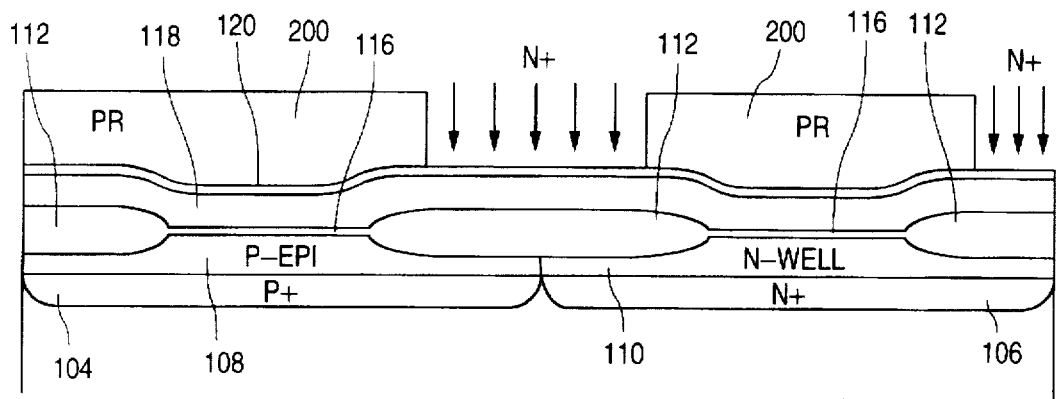
FIGS. 2A –2E are partial cross-sectional drawings illustrating an alternative method of fabricating a bipolar transistor structure in a CMOS process flow in accordance with the concepts of the present invention.

In an optional flow module which can be incorporated into the process flow described above in conjunction with FIGS. 1A–1P, as shown in FIG. 2A, beginning with the structure resulting from the process flow described above up to and including FIG. 1D, a poly 1 N+ implant mask 200 is formed over the FIG. 1D structure to expose the poly 1 layer 118 and ONO 120 overlying the isolation oxide region 112. An N+ implant is then performed to form a lower capacitor plate 202 and a polyresistor 204.

Figure 2B:
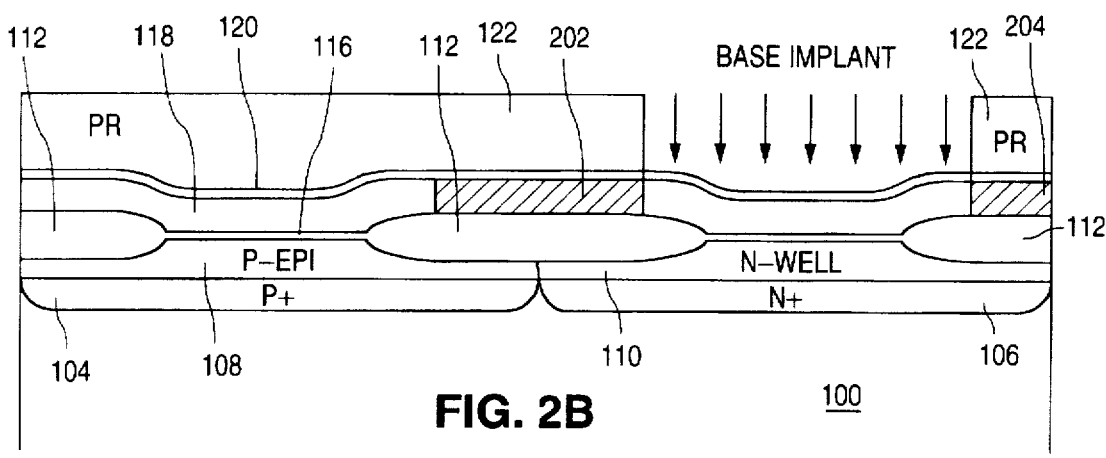
Figure 2C:
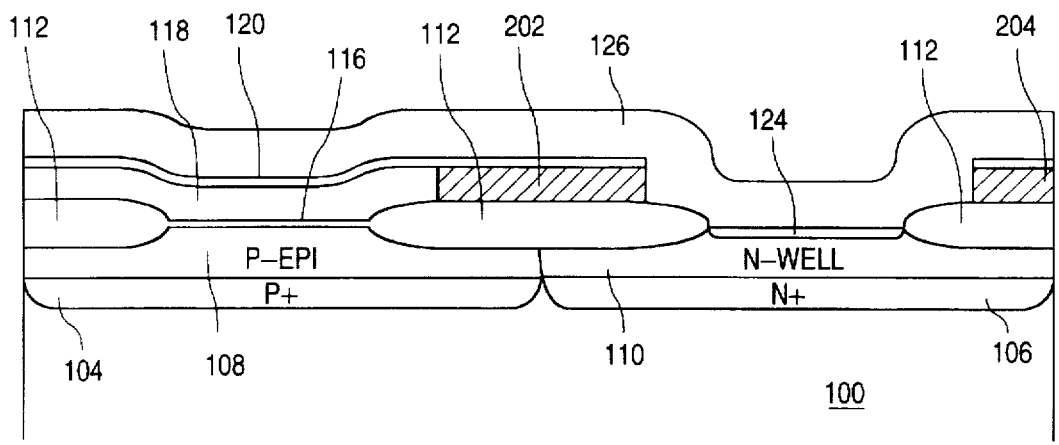
Figure 2D:
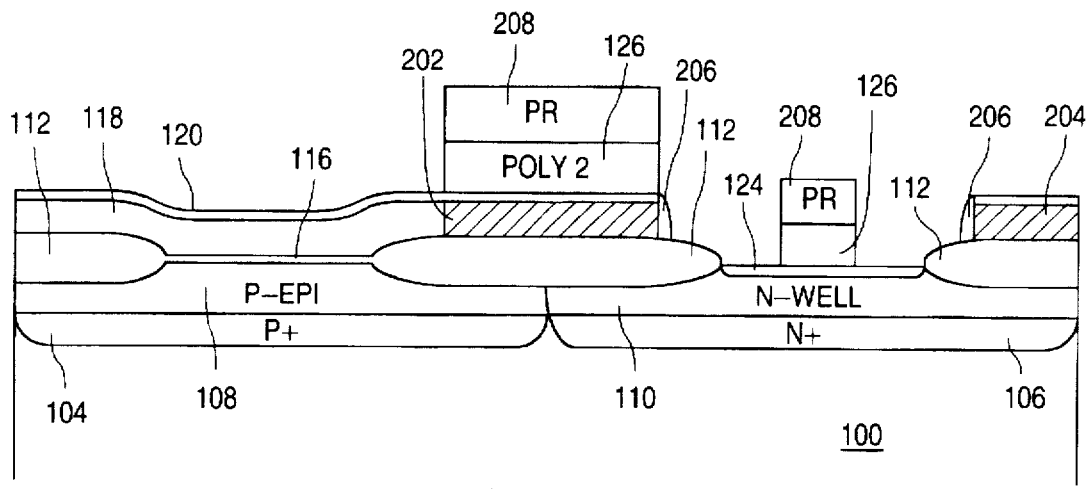

Next, shown in FIG. 2B, the process proceeds as described above, with a base mask, poly 1 etch, base implant and bipolar oxide etch.

Next, continuing with the above-described process flow, a second layer of polysilicon is deposited.

Then, an emitter mask and etch step is performed. The emitter mask and etch step includes the masking of the poly 2 layer overlying the lower plate of the capacitor such that an upper plate of the capacitor is formed during the emitter etch.

Next, returning to the flow described above, a poly gate mask and etch step is performed to form the gate regions of the CMOS devices.

Figure 2E:
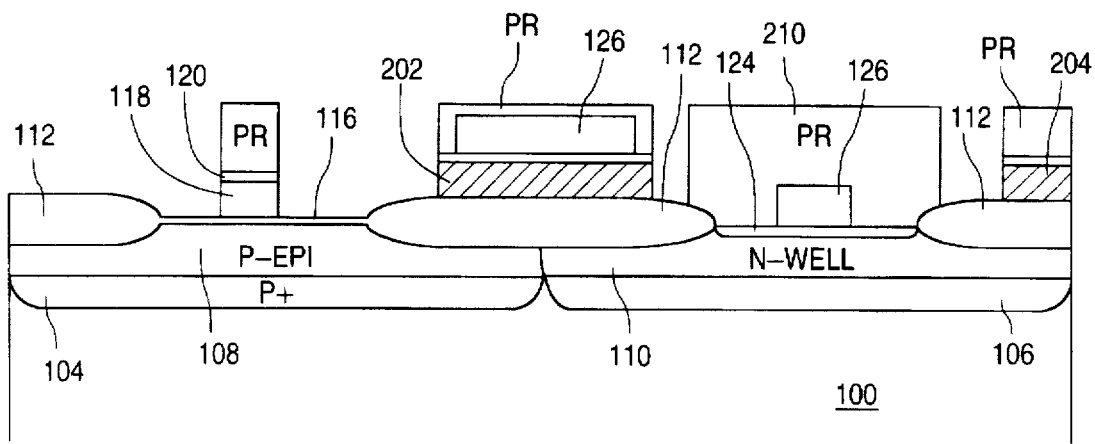

FIG. 2E shows the final device structure, including both the poly 1 gate for the CMOS devices, the poly 2 emitter for the NP devices, as well as the poly-poly capacitor and a poly resistor.

It should be understood that the various alternatives to the embodiments and invention described herein may be employed in practicing the invention. Thus, it is intended that the following claims define the scope of the invention and that structures and methods within the scope of these claims and equivalents be covered thereby.

What is claimed is:

1. A method of fabricating a bipolar transistor structure in a silicon substrate, wherein the silicon substrate includes a first substrate region having a first conductivity type and a second substrate region having a second conductivity type that is opposite to the first conductivity type, the first substrate region having a first epitaxial silicon region having the first conductivity type formed thereon, the second substrate region having a second epitaxial silicon region having the second conductivity type formed therein, the method comprising:

forming a layer of silicon oxide on the first and second epitaxial silicon regions;

forming a first layer of polysilicon on the layer of silicon oxide;

doping the first layer of polysilicon to a selected conductivity level;

forming a layer of dielectric material on the doped first layer of polysilicon;

removing the dielectric material and doped first layer of polysilicon from the second epitaxial silicon region to expose the silicon oxide formed on the second epitaxial silicon region while leaving the dielectric material and the first layer of polysilicon on the silicon oxide on the first epitaxial silicon region;

introducing dopant of the second conductivity type into the second epitaxial silicon region to form a base region having the second conductivity type in the second epitaxial silicon region;

removing the silicon oxide from the second epitaxial silicon region;

forming a second layer of polysilicon on the dielectric material overlying the first epitaxial silicon region and on the base region formed in the second epitaxial silicon region;

doping the second layer of polysilicon to a selected conductivity level;

etching the second layer of polysilicon to define a doped poly 2 emitter region on the base region and to remove the second layer of polysilicon overlying the first epitaxial silicon region;

etching the dielectric material and doped first layer of polysilicon overlying the first epitaxial silicon region to define a doped poly1 gate region and overlying dielectric material, the doped poly 1 gate region being separated from the first epitaxial silicon region by silicon oxide.

2. A method as in claim 1 and comprising the further step of, after the step of forming dielectric material on the doped first layer of polysilicon, introducing additional dopant into one or more selected regions of the doped first layer of polysilicon.

* * * * *

UNITED STATES PATENT AND TRADEMARK OFFICE
CERTIFICATE OF CORRECTION

PATENT NO.: 5,766,990
DATED: June 16, 1998
INVENTOR(S): Monir El-Diwany

It is certified that an error appears in the above-identified patent and that said Letters Patent is hereby corrected as shown below:

On the cover page, at [21], delete "Aug. 11, 1997" and replace with --Aug. 8, 1997--.

Signed and Sealed this

Sixth Day of April, 1999

Attest:

Q. TODD DICKINSON

*Attesting Officer*        *Acting Commissioner of Patents and Trademarks*